US011502073B2

(12) United States Patent
Hayashi (10) Patent No.: US 11,502,073 B2
(45) Date of Patent: Nov. 15, 2022

(54) SEMICONDUCTOR DEVICE AND POWER SOURCE CONTROL IC (71) Applicant: Seiko Epson Corporation, Tokyo (JP)

(72) Inventor: Masahiro Hayashi, Sakata (JP)

(73) Assignee: SEIKO EPSON CORPORATION ( * ) Notice: Subject to any disclaimer, the term of this patent is extended or adjusted under 35 U.S.C. 154(b) by 265 days.

(21) Appl. No.: 16/912,868

(22) Filed: Jun. 26, 2020

(65) Prior Publication Data
US 2020/0411508 A1 Dec. 31, 2020

(30) Foreign Application Priority Data

Jun. 28, 2019 (JP) .............................. JP2019-121899

(51) Int. Cl.
H01L 27/06 (2006.01)
H02M 3/335 (2006.01)
H01L 49/02 (2006.01)

(52) U.S. Cl.
CPC .......... H01L 27/0629 (2013.01); H01L 28/20 (2013.01); H02M 3/33523 (2013.01)

(58) Field of Classification Search
CPC . H01L 27/0629; H01L 27/0802; H01L 28/20; H02M 3/33523
See application file for complete search history.

(56) References Cited

U.S. PATENT DOCUMENTS

2008/0117653 A1 5/2008 Saito
2010/0022064 A1* 1/2010 Hall .................... H01L 23/5228
257/E21.004
2010/0148823 A1* 6/2010 Shimizu .............. H01L 29/7817
326/102
2011/0062554 A1* 3/2011 Hsing .................. H03K 17/082
257/536
2012/0154026 A1 6/2012 Karino et al.
2015/0311197 A1 10/2015 Saito
2017/0207296 A1 7/2017 Karino et al.

FOREIGN PATENT DOCUMENTS

| JP | 2008-153636 A | 7/2008 | |
| JP | 2017-130484 A | 7/2017 | |
| KR | 20130097329 A | * 9/2013 | ......... H01L 21/8239 |
| WO | 2009/078274 A1 | 6/2009 | |
| WO | 2014/203487 A1 | 12/2014 | |

* cited by examiner

Primary Examiner — Allan R Wilson
(74) Attorney, Agent, or Firm — Harness, Dickey & Pierce, P.L.C.

(57) ABSTRACT

This semiconductor device includes: a semiconductor substrate of a first conductive type; a first impurity layer of a second conductive type that is formed on a surface of the semiconductor substrate; a second impurity layer of the first conductive type that is formed to surround the first impurity layer on the surface of the semiconductor substrate; an insulating film that covers at least the first impurity layer; a first resistive element that is spiral-shaped and is provided on the insulating film; a second resistive element that is provided on an outer side of the first impurity layer in a planar view of the semiconductor substrate; and a first wiring that couples an end portion of the first resistive element on an outer peripheral side thereof and the second resistive element to each other.

8 Claims, 6 Drawing Sheets

SEMICONDUCTOR DEVICE AND POWER SOURCE CONTROL IC

The present application is based on, and claims priority from JP Application Serial Number 2019-121899, filed Jun. 28, 2019, the disclosure of which is hereby incorporated by reference herein in its entirety.

BACKGROUND

1. Technical Field

The present disclosure relates to a semiconductor device and a power source control IC.

2. Related Art

Switching power supplies are known (see JP-A-2008-153636, for example) that generate output voltage by switching a DC voltage, which is obtained by rectifying AC voltage from an AC power source, on and off with use of a switching element, which is a semiconductor element, and rectifying and smoothing the voltage.

JP-A-2008-153636 discloses a switching element that includes a resistive layer on an element constituted by a so-called JFET formed via an insulating film. The JFET includes a source region, a drain region on the inner side of the source region, and a gate electrode. Also, the resistive layer functions to divide voltage that has been applied to the switching element. Power consumption can be reduced by increasing the resistance of the resistive layer. In JP-A-2008-153636, the resistors are wired into a spiral shape in a planar view of the element in order to increase the resistance of the resistive layer, thus enhancing the resistance.

JP-A 2008-153636 is an example of related art.

SUMMARY

However, in order to avoid degrading the characteristics of the JFET, that is to say, in order for electrical current to stably flow between the source region and the drain region, it is necessary to arrange the resistive layer so as to not extend beyond the source region in a planar view of the element. That is to say, the region in which the resistive layer can be installed is limited. For this reason, with a configuration such as the one described in JP-A-2008-153636, the resistance of the resistive layer cannot be sufficiently increased, and thus power consumption is not sufficiently reduced.

The disclosure can be realized based on the following.

A semiconductor device according to the present example application includes:
- a semiconductor substrate of a first conductive type;
- a first impurity layer of a second conductive type that is formed on a surface of the semiconductor substrate;
- a second impurity layer of the first conductive type that is formed to surround the first impurity layer on the surface of the semiconductor substrate;
- an insulating film that covers at least the first impurity layer;
- a first resistive element that is spiral-shaped and is provided on the insulating film;
- a second resistive element that is provided on an outer side of the first impurity layer in a planar view of the semiconductor substrate; and
- a first wiring that couples an end portion of the first resistive element on an outer peripheral side thereof and the second resistive element to each other.

A power source control IC according to the present example application includes:
- a startup circuit;
- the semiconductor device according to claim 1; and
- a control circuit that is transmits, to the startup circuit, a signal for switching a voltage stepped-down by the semiconductor device on and off.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

The following is a detailed description of a semiconductor device and a power source control IC of the disclosure based on preferable embodiments shown in the attached drawings.

Embodiments

Figure 1:
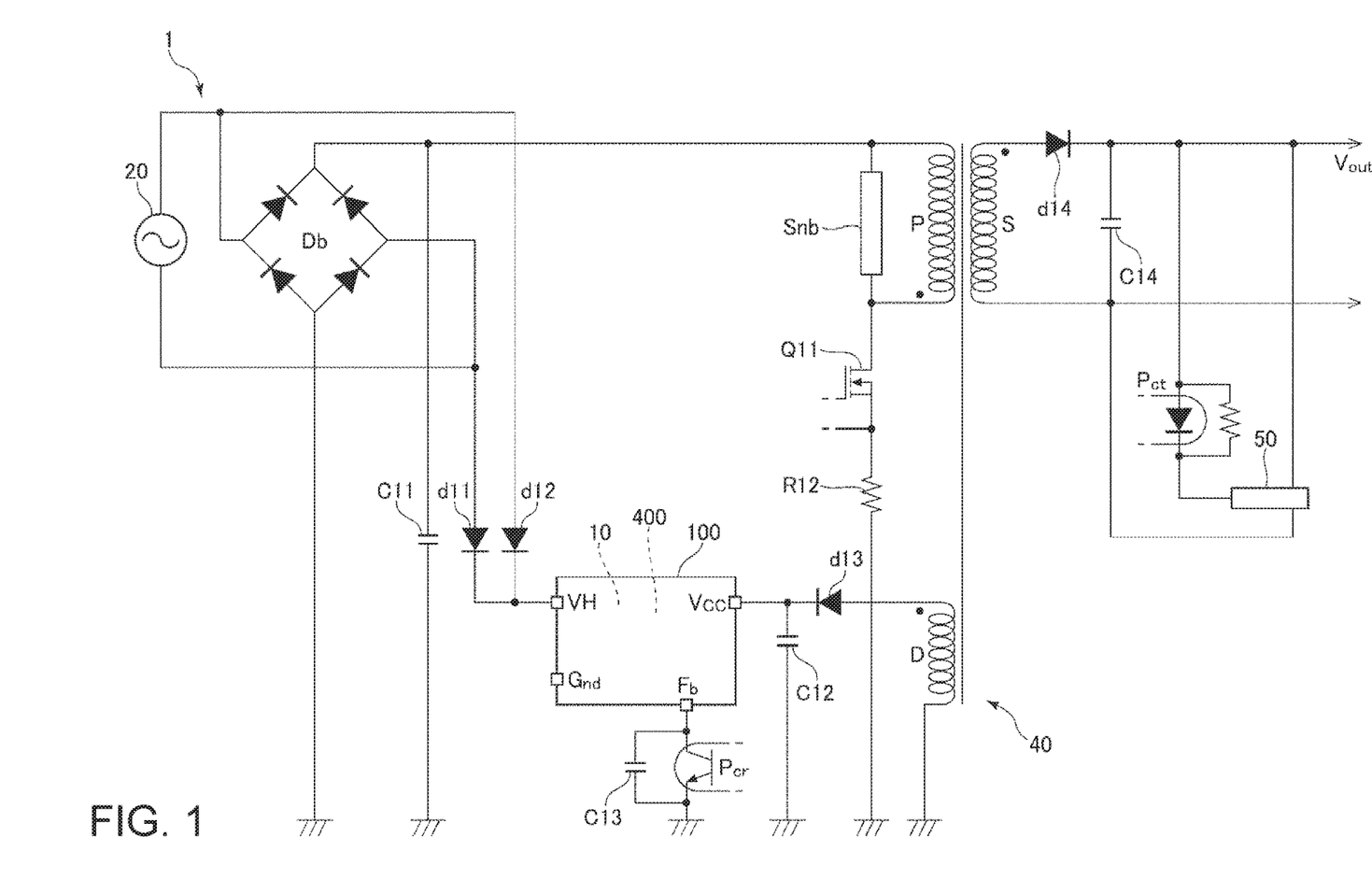
FIG. 1 is a circuit diagram of a power source control IC of the disclosure.
Figure 2:
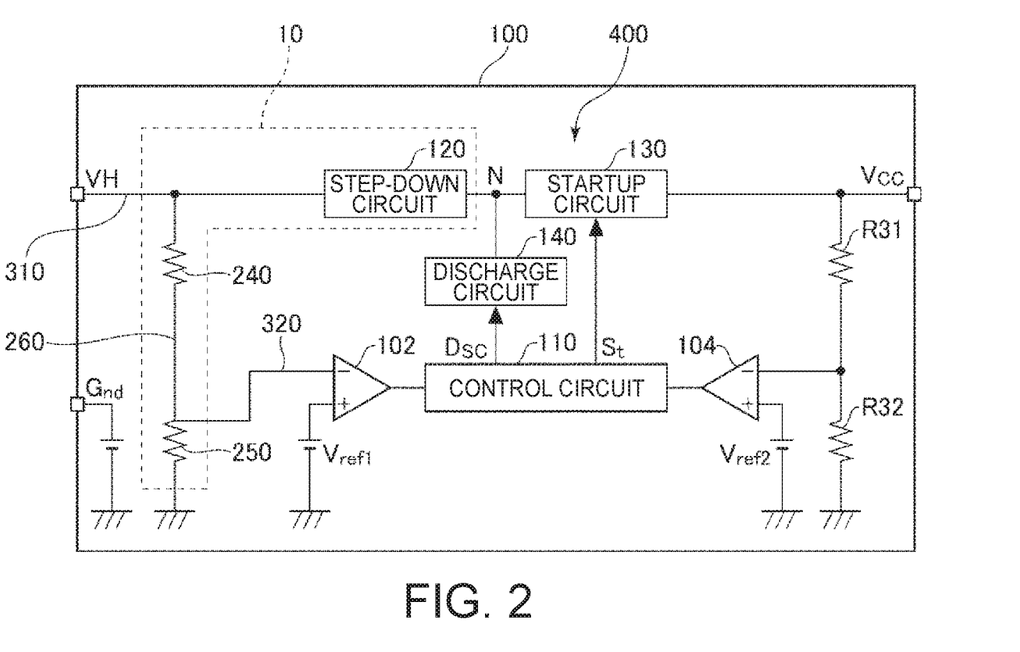
FIG. 2 is a circuit diagram showing a power source control device that is included in the power source control IC shown in FIG. 1.
Figure 3:
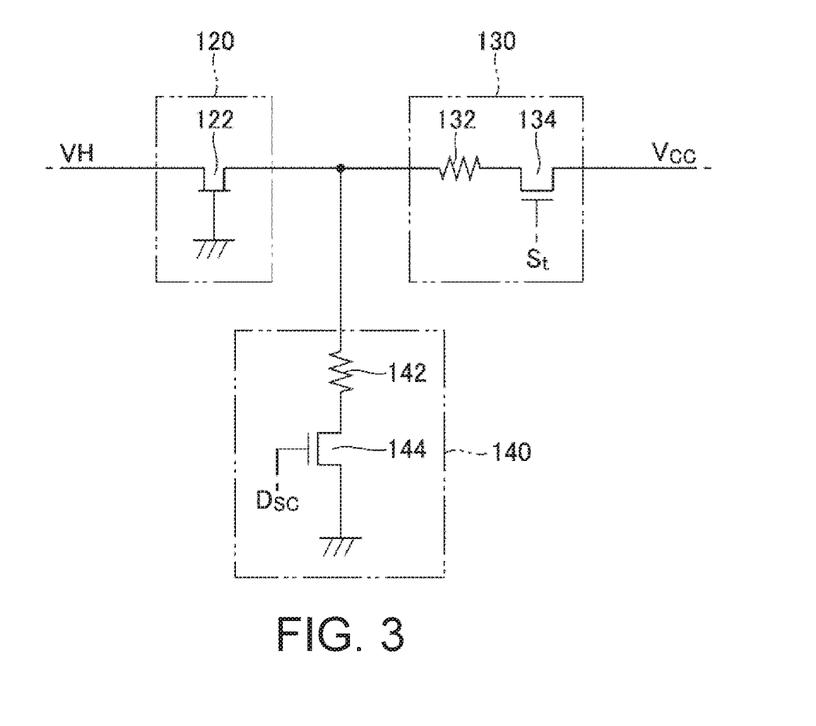
FIG. 3 is a circuit diagram showing the details of a step-down circuit, a startup circuit, and a discharge circuit shown in FIG. 2.
Figure 4:
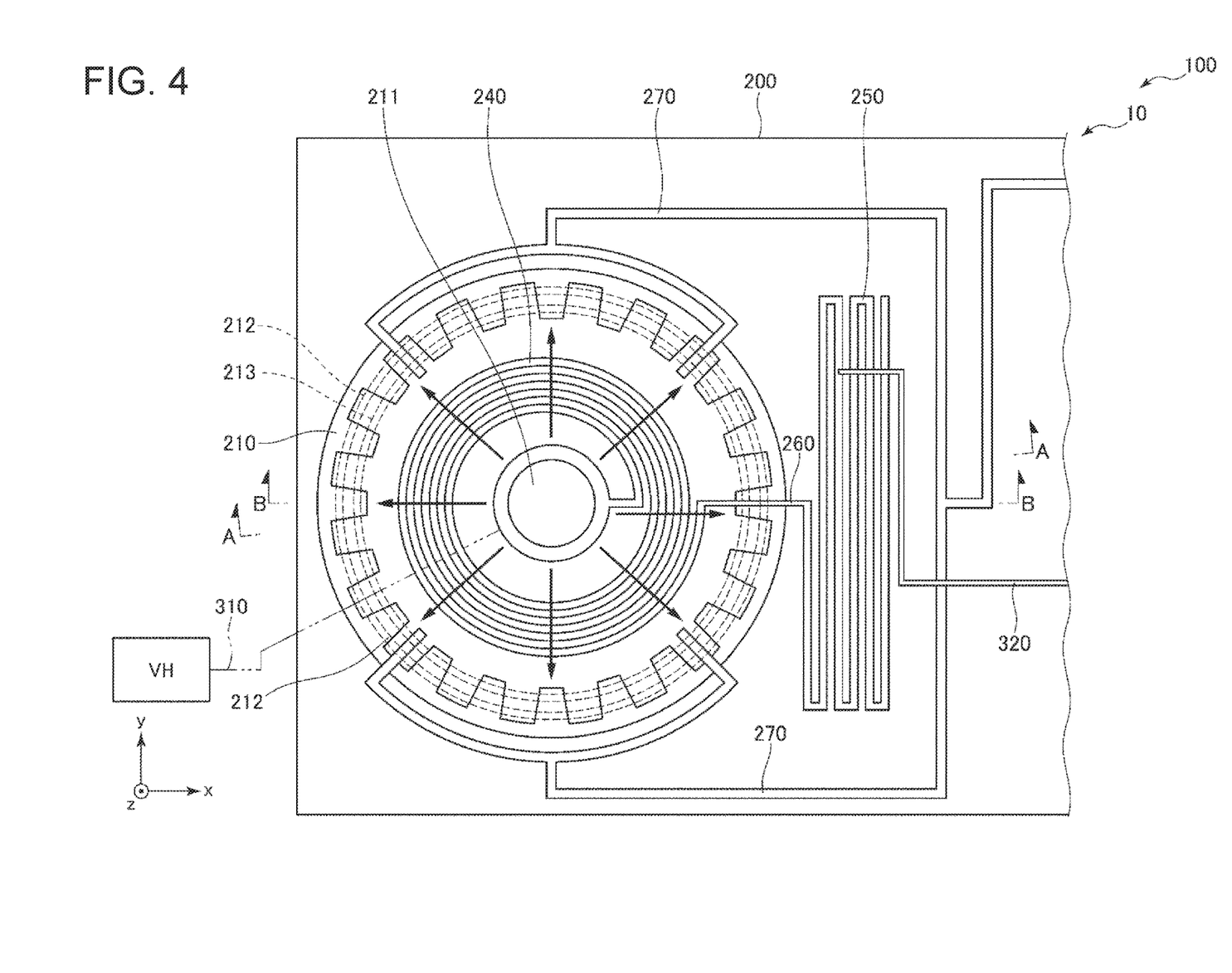
FIG. 4 is a plan view of a semiconductor device shown in FIG. 2.
Figure 5:
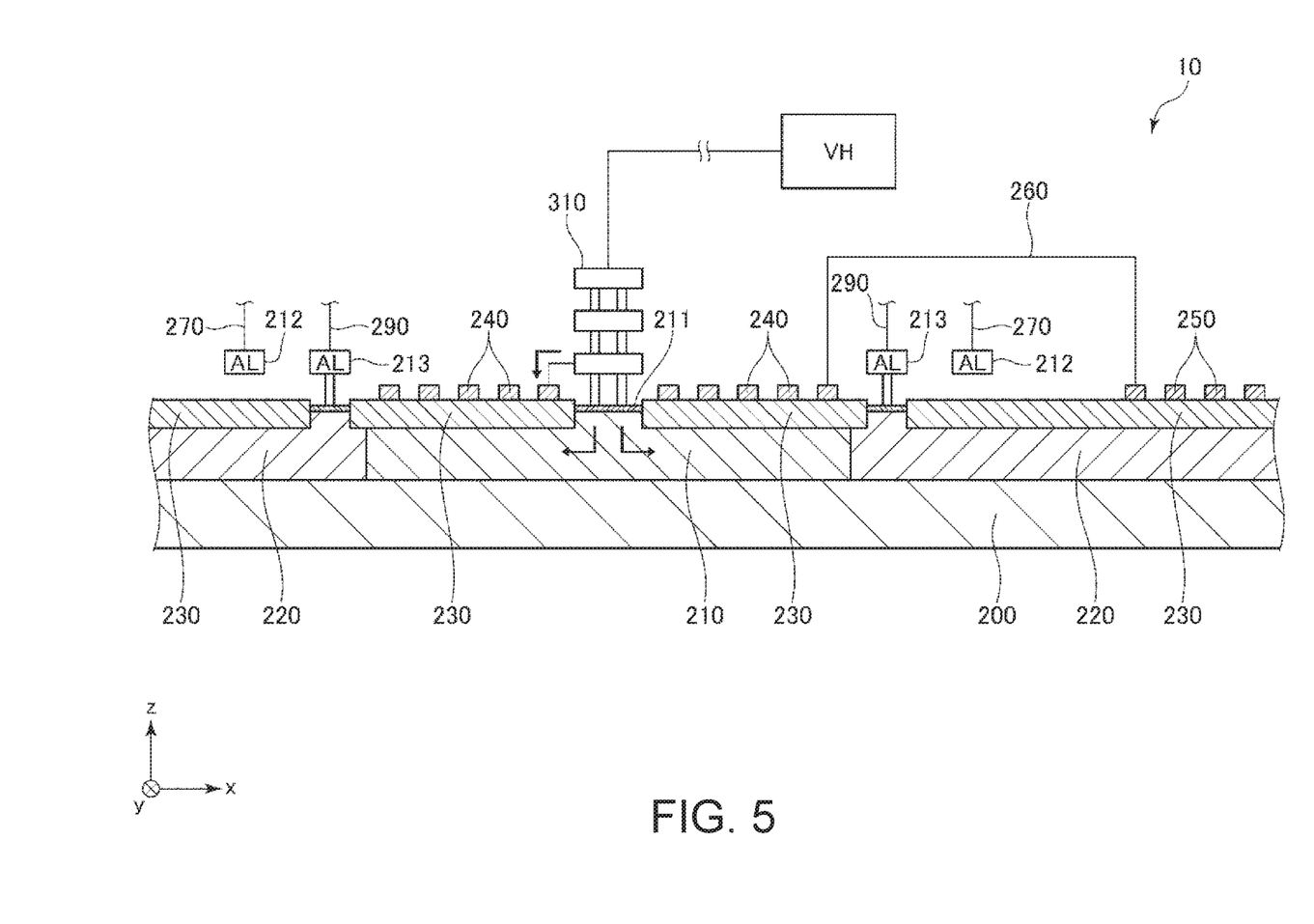
FIG. 5 is a sectional view taken along line A-A in FIG. 4.
Figure 6:
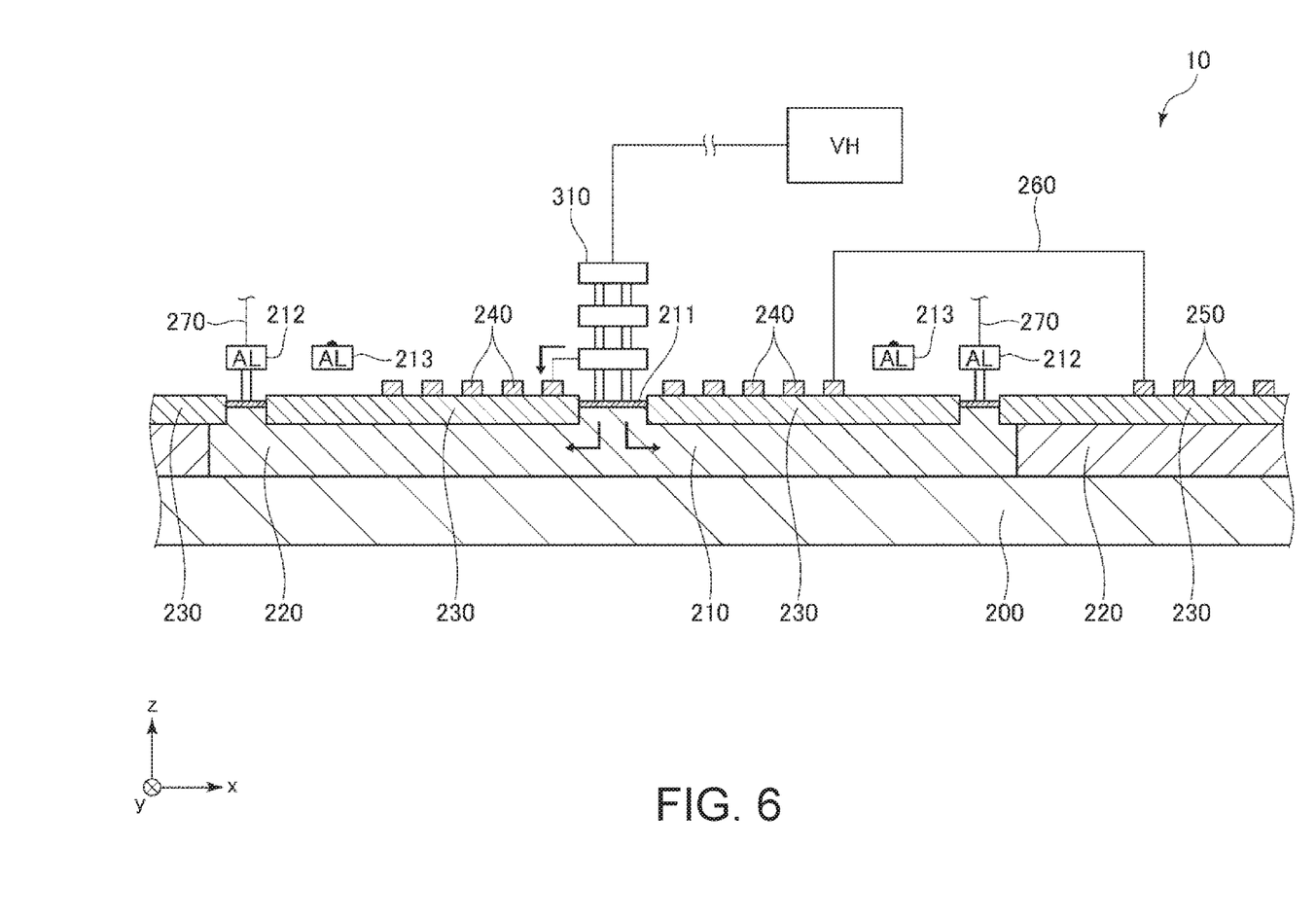
FIG. 6 is a sectional view taken along line B-B in FIG. 4.
Figure 7:
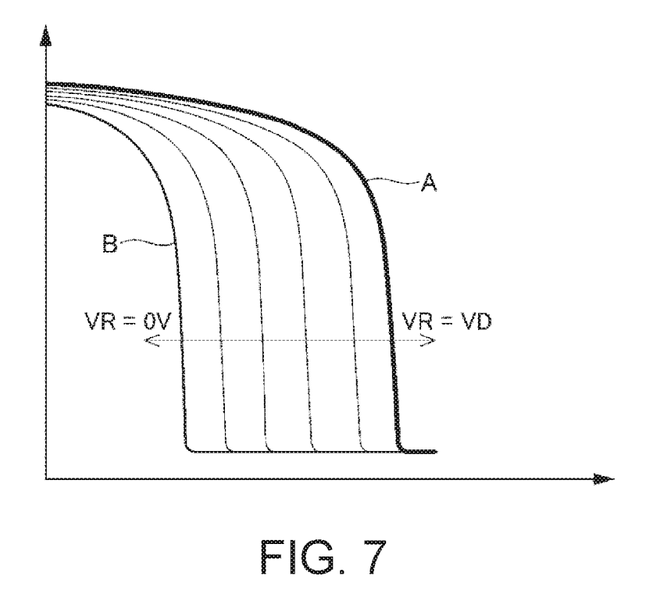
FIG. 7 is a graph for illustrating pinch-off in the semiconductor device shown in FIG. 4.
Figure 8:
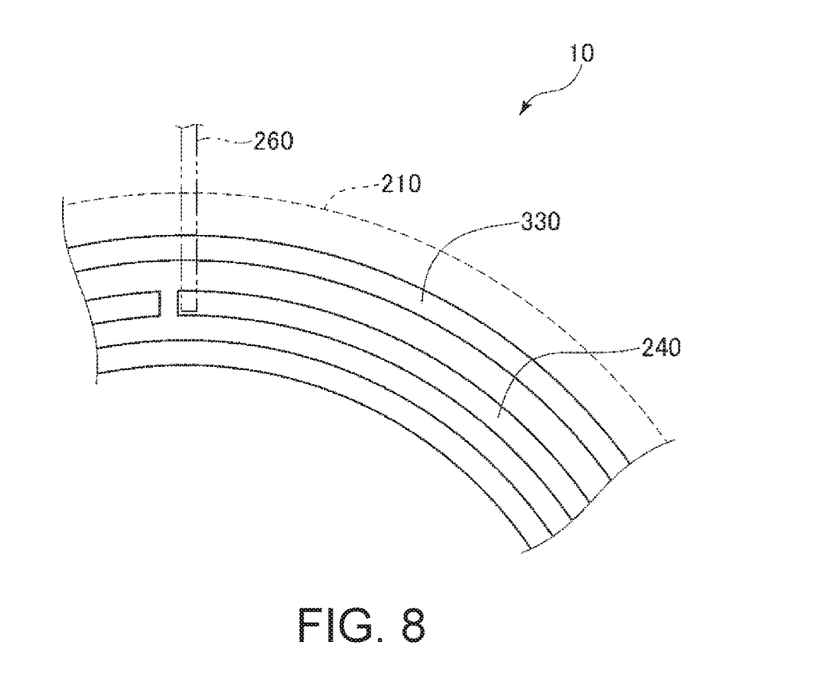
FIG. 8 is an enlarged view of the outer edge portion of a first resistive element shown in FIG. 4 and the surrounding area.

FIG. 1 is a circuit diagram of a power source control IC of the disclosure. FIG. 2 is a circuit diagram showing a power source control device that is included in the power source control IC shown in FIG. 1. FIG. 3 is a circuit diagram showing the details of a step-down circuit, a startup circuit, and a discharge circuit shown in FIG. 2. FIG. 4 is a plan view of a semiconductor device shown in FIG. 2. FIG. 5 is a sectional view taken along line A-A in FIG. 4. FIG. 6 is a sectional view taken along line B-B in FIG. 4. FIG. 7 is a graph for illustrating pinch-off in the semiconductor device shown in FIG. 4. FIG. 8 is an enlarged view of the outer edge portion of a first resistive element shown in FIG. 4 and the surrounding area.

Also, FIGS. 4 to 6 show three mutually orthogonal axes to facilitate the following description, namely an x-axis, a y-axis, and a z-axis. Also, in the following description, the direction parallel to the x-axis is also referred to as the "x-axis direction", the direction parallel to the y-axis is also referred to as the "y-axis direction", and the direction parallel to the z-axis is also referred to as the "z-axis direction". Also, in the following description, the leading end sides of the arrows shown in the drawings are referred to as "+" (plus) and the base end sides are referred to as "−" (minus), and therefore the direction parallel to the +x-axis direction is also referred to as the "+x-axis direction", the direction parallel to the −x-axis direction is also referred to as the "−x-axis direction", the direction parallel to the +y-axis direction is also referred to as the "+y-axis direction", the direction parallel to the −y-axis direction is also referred to as the "−y-axis direction", the direction parallel to the +z-axis direction is also referred to as the "+z-axis direction", and the direction parallel to the −z-axis direction is also referred to as the "−z-axis direction". Also, in order to facilitate the following description, the upper sides of FIGS. 5 and 6 are referred to as "up" or "upward", and the lower sides of FIGS. 5 and 6 are referred to as "down" or "downward".

Note that FIG. 4 appears to show portions of the wiring intersecting with each other, but the wiring is actually disposed on different layers via an inter-layer insulating film, and thus the portions of the wiring that appear to intersect each other are not conductive with each other.

First, the configuration of a switching power supply 1 that includes a semiconductor device 10 of the disclosure will be described.

As shown in FIG. 1, the switching power supply 1 is a flyback switching power supply. Specifically, the switching power supply 1 allows electrical current to flow to a primary wound wire P of a transformer 40 by switching a transistor Q11 on and stores energy, outputs the stored energy from a secondary wound wire S of the transformer 40 via a diode d14 by switching the transistor Q11 off, performs smoothing with use of a capacitor C14, and generates DC voltage Vout.

A diode bridge Db rectifies the AC voltage from an AC power source 20. The positive-side terminal of the diode bridge Db is coupled to one end of the primary wound wire P in the transformer 40 and one end of a capacitor C11, while the negative-side terminal of the diode bridge Db and the other end of the capacitor C11 are grounded by a node Gnd whose voltage is zero.

The transformer 40 includes the secondary wound wire S and an auxiliary wound wire D in addition to the primary wound wire P, and of these wires, the other end of the primary wound wire P is coupled to the drain node of the transistor Q11. The transistor Q11 is an example of a switching element and, for example, may be an N-channel MOSFET, and the source node of the transistor Q11 may be coupled to one end of a resistive element R12. The other end of the resistive element R12 is grounded to the node Gnd. For this reason, the primary wound wire P and the transistor Q11 are provided in series between the positive-side terminal and the negative-side terminal of the diode bridge Db.

Note that a snubber circuit Snb is provided between one end and the other end of the primary wound wire P in the transformer 40, and absorbs excessive voltage that occurs in the primary wound wire P due to the transistor Q11 being switched on and off.

One end of the secondary wound wire S is coupled to the anode of the diode d14. The capacitor C14 is coupled to the cathode of the diode d14 and to the other end of the secondary wound wire S, and outputs voltage that has been smoothed by the capacitor C14 as Vout. For this reason, the diode d14 and the capacitor C14 function as an example of a first output circuit that rectifies and smooths voltage induced in the secondary wound wire S. The anode of a light-emitting diode Pct in a photocoupler is coupled to the cathode of the diode d14, and the cathode of the light-emitting diode Pct is coupled to an error amp 50. The error amp 50 allows electrical current that depends on a deviation between the voltage Vout and an internal reference voltage to flow to the light-emitting diode Pct.

One end of the auxiliary wound wire D in the transformer 40 is coupled to the anode of a diode d13, and the cathode of the diode d13 is coupled to a node Vcc, which acts as a power source terminal of a power source control device 100, and is coupled to one end of a capacitor C12. Note that the other end of the auxiliary wound wire D and the other end of the capacitor C12 are grounded by the node Gnd.

The voltage that is induced in the auxiliary wound wire D of the transformer 40 is rectified by the diode d13, is smoothed and charged by the capacitor C12, and is supplied to the node Vcc as the power source voltage of the power source control device 100. For this reason, the diode d13 and the capacitor C12 function as an example of a second output circuit that rectifies and smooths voltage induced in the auxiliary wound wire D. In the capacitor C12, voltage supplied via a node VH, which will be described later, may also be charged, in addition to the case in which voltage obtained by the diode d13 rectifying the induced voltage of the auxiliary wound wire D is charged.

An emitter of a phototransistor Pcr of the photocoupler is grounded to the node Gnd, and a collector is coupled to a node Fb in the power source control device 100. A capacitor C13 is coupled in parallel to the phototransistor Pcr. The power source control device 100 may be integrated with a semiconductor for example, and generates a voltage based on the electrical current that flows through the phototransistor Pcr at the node Fb pulled up by a resistor from an internal power supply voltage. For this reason, voltage is generated at the node Fb in accordance with the deviation from the voltage Vout. Though not shown in the drawings, the power source control device 100 detects the voltage of the node Fb and switches the transistor Q11 on and off in the direction in which the deviation indicated by the detected voltage becomes zero. Specifically, the power source control device 100 generates a PWM signal in the direction in which the deviation becomes zero, and supplies the PWM signal to the gate node of the transistor Q11.

Also, the AC voltage from the AC power source 20 undergoes full-wave rectification by diodes d11 and d12, and is applied to the node VH in the power source control device 100. Voltage is not sufficiently charged in the capacitor C12 immediately after the AC power source 20 is connected or immediately after the AC power source 20 is powered on. Also, if the transistor Q11 is not switched on or off for some, voltage is not induced in the auxiliary wound wire D, and thus the voltage charged in the capacitor C12 decreases, and there will be insufficient charge voltage. In readiness for such a case, the power source control device 100 also performs control for using voltage applied to the node VH to charge the capacitor C12.

The following is a description of the power source control device 100.

The power source control device 100 shown in FIG. 2 includes a first resistive element 240, a second resistive element 250, a resistive element R31, a resistive element R32, comparators 102 and 104, a control circuit 110, a step-down circuit 120, a startup circuit 130, and a discharge circuit 140.

The step-down circuit 120 steps down the voltage of the node VH and applies the stepped-down voltage to a node N. When switched on, the startup circuit 130 allows a constant electrical current to flow from the node N to the node Vcc, and charges the capacitor C12. When switched on, the discharge circuit 140 discharges an electrical charge via the node N, the electrical charge having been stored in a capacitance that is parasitic to the node VH.

As shown in FIG. 3, the step-down circuit 120 is constituted by a JFET (Junction Field Effect Transistor) transistor 122. The step-down circuit 120 steps down the voltage of the node VH by the pinch-off component of the transistor 122 and applies the stepped-down voltage to the node N.

The startup circuit 130 includes a resistive element 132 and a transistor 134 that are, for example, coupled in series between the node N and the node Vcc. A signal St that is output from the control circuit 110 is supplied to the gate node of the transistor 134, and the signal St is used to switch on or switch off the charging of the capacitor C12 via the node Vcc. If the startup circuit 130 is switched on, the voltage that is applied to the node VH is applied to the node Vcc after being stepped down by the step-down circuit 120.

The discharge circuit 140 includes a resistive element 142 and a transistor 144 that are, for example, coupled in series to the node N and to the node Gnd. A signal Dsc that is output from the control circuit 110 is supplied to the gate node of the transistor 144, and the signal Dsc is used to perform on and off switching. When switched on, the transistor 144 discharges an electrical charge that has been stored in a capacitance that is parasitic to the node VH, and applies the discharged electrical charge to the node Gnd by way of the transistor 122 and the resistive element 142.

The startup circuit 130, the control circuit 110, and the semiconductor device 10, which will be described later, constitute a power source control IC 400 of the disclosure.

As shown in FIG. 2, the first resistive element 240 and the second resistive element 250 divide the voltage of the node VH and apply the divided voltage to the negative input terminal (−) of the comparator 102. A voltage Vref1 is applied to the positive input terminal (+) of the comparator 102.

The comparator 102 outputs a different signal level between when the voltage of the negative input terminal (−) is less than the voltage Vref1 applied to the positive input terminal (+), and when said voltage is greater than or equal thereto. The comparator 104 is a so-called hysteresis comparator.

The resistive element R31 and the resistive element R32 divide the voltage of the node Vcc and apply the divided voltage to the negative input terminal (−) of the comparator 104. A voltage Vref2 is applied to the positive input terminal (+) of the comparator 104.

The following is a detailed description of the semiconductor device 10.

As shown in FIGS. 4 to 6, the semiconductor device 10 includes a semiconductor substrate 200, a first impurity layer 210, a second impurity layer 220, an insulating film 230, the first resistive element 240, the second resistive element 250, a first wiring 260, and a second wiring 270. Note that the insulating film 230 is omitted from FIG. 4 in order to clearly show the features of the semiconductor device 10.

The semiconductor substrate 200 is a substrate formed with the layers described above. The semiconductor substrate 200 is of a p-type conductive type serving as a first conductive type. The semiconductor substrate 200 may be constituted by a p-type silicon substrate, for example.

The first impurity layer 210 is formed on the surface of the semiconductor substrate 200, that is to say, on the +z-axis side surface of the semiconductor substrate 200. The first impurity layer 210 is of an n-type conductive type serving as a second conductive type. The first impurity layer 210 is a region that is formed by diffusing impurity ions of a substance such as phosphorus or arsenic, for example, in the semiconductor substrate 200. The area in and around the middle of the first impurity layer 210 is electrically coupled to wiring 310. Thus, voltage from the node VH shown in FIG. 2 is applied to the first impurity layer 210. The coupled part of the first impurity layer 210 is constituted by a drain electrode 211.

Also, as shown in FIG. 4, the first impurity layer 210 is electrically coupled to a ring-shaped source electrode 212. Also, the source electrode 212 is electrically coupled to the second wiring 270 via four points.

When voltage is applied to the drain electrode 211 of the first impurity layer 210, if the difference in electrical potential between the source and the gate is less than or equal to a predetermined voltage (a pinch-off voltage), then electrical current flows outward from the drain electrode 211 in the center portion of the first impurity layer 210. Thus, electrical current flows to the second wiring 270 via the source electrode 212. The second wiring 270 is coupled to a terminal (not shown) and is output to the outside thereof.

The second wiring 270 is one wire in the center-right side of FIG. 4, and branches into four wires near the first impurity layer 210, with each of the four branch wires being coupled to the source electrode 212.

Thus, the semiconductor device 10 includes the first impurity layer 210 and the second wiring 270 that is electrically coupled thereto, and the second wiring 270 and the first impurity layer 210 are coupled at a plurality of locations (four in the present embodiment). Thus, as shown by the arrows in FIG. 4, when electrical current flows from the drain electrode 211 to the source electrode 212, the electrical current flows from the drain electrode 211 in as much of a uniformly radial manner as possible.

Also, the first impurity layer 210 has a circular shape in a planar view of the semiconductor substrate 200, and the locations at which the second wiring 270 and the first impurity layer 210 are coupled are the circular edge portions and are evenly spaced along the outer peripheral direction thereof. Thus, the flow of electrical current from the drain electrode 211 in as much of a uniformly radial manner as possible can be even more effectively exhibited.

The second impurity layer 220 is formed on the surface of the semiconductor substrate 200, that is to say, on the upper surface of the semiconductor substrate 200. Also, the second impurity layer 220 is provided on the outer side of the first impurity layer 210 in a planar view of the semiconductor substrate 200. The second impurity layer 220 is of a p-type conductive type serving as a first conductive type. The second impurity layer 220 is a region that is formed by implanting impurity ions of a substance such as boron or boron fluoride, for example, in the semiconductor substrate 200.

The second impurity layer 220 is electrically coupled to a ring-shaped gate electrode 213, and while not shown in FIG. 4, is electrically coupled via a plurality of points by wiring 290. Note that the wiring 270 and the wiring 290 overlap each other in a planar view, but are positioned in different layers via an inter-layer insulating film. The other end of the wiring 290 is electrically coupled to a terminal (not shown), and is coupled to a ground electrode via said terminal.

Such a drain electrode 211, source electrode 212, and gate electrode 213 constitute a principal part of the transistor 122 shown in FIG. 3.

The insulating film 230 covers the surface of the first impurity layer 210. The insulating film 230 is constituted by a LOCOS oxide film. The thickness of the insulating film 230 is preferably 3,000 Å or more and 8,000 Å or less, and more preferably 4,000 Å or more and 7,000 Å or less. A configuration like the one described above makes it possible to sufficiently ensure insulating performance while preventing the insulating film from being too thick.

The following is a description of the first resistive element 240 and the second resistive element 250, which function to divide voltage that is applied from the node VH.

The first resistive element 240 is provided on the insulating film 230. The first resistive element 240 has a spiral shape in a planar view. That is to say, a long resistor extends from the inner periphery to the outer periphery of the first resistive element 240 while concentrically describing a circular arc. Thus, compared to a case where one straight-line shaped resistor is provided, sufficient length can be ensured, and the total resistance of the first resistive element 240 can be increased. Such a first resistive element 240 may be constituted by a thin film resistor such as a polysilicon or CrSi resistor, for example.

As shown in FIGS. 4 to 6, the end portion of the first resistive element 240 on the inner peripheral side thereof is coupled to wiring 310, and voltage supplied from the node VH is applied thereto. Note that as shown in FIGS. 5 and 6, the wiring 310 branches midway, and the branches are respectively coupled to the first resistive element 240 and the drain electrode described above. Also, the end portion of the first resistive element 240 on the outer peripheral side thereof is coupled to the first wiring 260. Also, the other end portion of the first wiring 260 is coupled to the second resistive element 250. That is to say, the first resistive element 240 and the second resistive element 250 are coupled to each other by one wire of the first wiring 260. That is to say, in a planar view, the wiring that straddles the first impurity layer 210 is only the first wiring 260, and therefore it is possible to further stabilize the flow of electrical current from the drain electrode 211 to the source electrode 212.

As shown in FIG. 4, the second resistive element 250 is provided separately from the first resistive element 240 on the +x-axis side of the first resistive element 240. That is to say, the second resistive element 250 is provided on the outer side of the first impurity layer 210 in a planar view. Also, as shown in FIGS. 5 and 6, the second resistive element 250 is provided on the insulating film 230 that is positioned on the +x-axis side of the first impurity layer 210.

Also, the second resistive element 250 is routed while shifting between the +y-axis direction and the −y-axis direction. That is to say, the second resistive element 250 has a serpentine shape that doubles back and forth a plurality of times. In other words, the second resistive element 250 includes a plurality of straight resistors that are long in the y-axis direction, a first doubled back portion that couples the end of the 2i−1th straight resistor and the end of the 2ith straight resistor, and a second doubled back portion that couples the other end of the 2ith straight resistors and the other end of the 2i+1th straight resistor (i is an integer of 1 or more). Thus, compared to a case where one straight-line shaped resistor is provided, sufficient length can be ensured, and the total resistance of the second resistive element 250 can be increased.

Also, wiring 320 is coupled to the second resistive element 250 at a midway point thereof, and the second resistive element 250 is coupled to a terminal (not shown) via the wiring 320, and is thus coupled to the outside thereof. Since the wiring 320 couples the second resistive element 250 to a terminal at a midway point thereof, it is possible to set the voltage of the end portion of the first resistive element 240 on the outer peripheral side thereof to more than 0 V. This will be explained in more detail later.

Such a second resistive element 250 may be constituted by a thin film resistor such as polysilicon or CrSi resistor, for example.

The configuration of the semiconductor device 10 was described above.

In order to avoid degrading the characteristics of the JFET, that is to say, in order to stabilize the electrical current that flows from the drain electrode 211 to the source electrode 212, it is necessary to provide the first resistive element 240 so as to not straddle the source electrode of the first impurity layer 210 in a planar view. That is to say, it is necessary to install the first resistive element 240 on the inner side of the first impurity layer 210. In the disclosure, the first resistive element 240 has a spiral shape and has a longer resistor in order to increase the total resistance value of the first resistive element 240 as much as possible inside a limited region. Thus, the total resistance value of the first resistive element 240 can be increased and the power consumption thereof can be reduced.

However, limiting the first resistive element 240 to being arranged so as to not straddle the source electrode 212 of the first impurity layer 210 in a planar view limits how much the total resistance value of the first resistive element 240 increases. That is to say, reducing power consumption while maintaining the characteristics of the JFET are contrary objectives, and it is difficult to achieve both to a high standard.

Therefore, the disclosure includes the first resistive element 240 and is also provided with the second resistive element 250 at a position that is on the outer side of the first impurity layer 210, that is to say, a position at which the second resistive element 250 does not overlap with the first impurity layer 210, and these resistive elements are coupled in series by the first wiring 260. Thus, the total resistance value can be increased compared to a case where the second resistive element 250 is not provided, without the first resistive element 240 or the second resistive element 250 straddling the first impurity layer 210 in a planar view. Thus, the consumption of power can be further reduced, while maintaining the characteristics of the JFET.

Here, in the foregoing description, while it was explained that positioning the end portion of the first resistive element 240 on the outer peripheral side thereof on the inner side of the first impurity layer 210 in a planar view enables the JFET characteristics to be maintained, it was found that the following disadvantage results from providing the first resistive element 240 on the first impurity layer 210.

Depending on the magnitude of the voltage applied to the first resistive element 240, an n-type FET may be formed by the end portion of the first resistive element 240 on the outer peripheral side thereof and the first impurity layer 210 that is below said end portion. That is to say, the end portion of the first resistive element 240 functions as a gate electrode, and furthermore, the first impurity layer 210 directly below said end portion is formed with a region that behaves like a pseudo drain electrode and a pseudo source electrode. These pseudo-electrodes inadvertently generate electrical current due to behaving like an n-type FET. In the following description, this FET will be referred to as a parasitic FET. Electrical current generated by the parasitic FET has an adverse effect on the original electrical current that flows between the drain electrode 211 and the source electrode 212 of the semiconductor device 10, and restricts the electrical current.

Also, it is known that as the previously-described parasitic FET approaches the source electrode 212, that is to say, as the end portion of the first resistive element 240 on the outer peripheral side thereof approaches the source electrode 212, the electrical current generated by the parasitic FET increasingly degrades pinch-off.

Therefore, with the semiconductor device 10, in a planar view of the semiconductor substrate 200, the outermost peripheral portion of the first resistive element 240, that is to say, the end portion of the first resistive element 240 on the outer peripheral side thereof, is on the inner side of the first impurity layer 210 and is separated from the first impurity layer 210. Thus, it is possible to ease the adverse effects caused by the parasitic FET as described above, and to mitigate disadvantages such as those described above.

Also, the outermost peripheral portion of the first resistive element 240, that is to say, the end portion of the first resistive element 240 on the outer peripheral side thereof, and the first impurity layer 210 are preferably separated by a distance of 13 μm or more, or more preferably by a distance of 20 μm or more. Thus, as described above, it is possible to make the effect obtained by separating the outermost peripheral portion of the first resistive element 240 from the first impurity layer 210 more marked.

Also, there is a close relationship between pinch-off degradation and the voltage at the end portion of the first resistive element 240 on the outer peripheral side thereof. A curved line A in the graph shown in FIG. 7 is a curved line showing characteristics in a case where the voltage applied to the end portion of the first resistive element 240 on the outer peripheral side thereof is greater than or equal to the pinch-off voltage of the JFET. Conversely, a curved line B is a curved line showing characteristics in a case where the voltage applied to the end portion of the first resistive element 240 on the outer peripheral side thereof is 0 V. As can be understood from the curved lines A and B, the smaller the voltage is at the end portion of the first resistive element 240 on the outer peripheral side thereof, the further pinch-off degrades.

As described above, the semiconductor device 10 includes the first resistive element 240 and the second resistive element 250, and therefore the voltage at the end portion of the first resistive element 240 on the outer peripheral side thereof is not 0 V. For example, in JP-A-2008-153636, the end portion of a spiral-shaped resistive element, which corresponds to the first resistive element 240, on the outer peripheral side thereof is 0 V, thereby suppressing pinch-off degradation more than existing configurations.

Also, as shown in FIG. 8, the outer peripheral side of the first resistive element 240 is provided with a dummy resistor 330. The dummy resistor 330 is obtained by forming a long resistor into a circular-arc shape or a spiral shape in a planar view. The dummy resistor 330 is formed as an extension of the spiral shape of the first resistive element 240, and so as to form a circular arc having the same curvature as the first resistive element 240. Also, the dummy resistor 330 is arranged separately from the first resistive element 240. That is to say, the dummy resistor 330 and the first resistive element 240 are not electrically coupled. Also, there is no particular limitation to the material from which the dummy resistor 330 is formed, and the dummy resistor 330 may be constituted by the same material as that of the first resistive element 240, that is to say constituted by a thin film resistor such as polysilicon or CrSi resistor.

The dummy resistor 330 and the first resistive element 240 cover the first impurity layer 210, and therefore the first resistive element 240 can be caused to function as a field plate, and the reliability of the JFET can be increased.

Thus, the semiconductor device 10 includes a dummy resistor 330 that is provided as an extension of the spiral shape of the first resistive element 240 and is not electrically coupled to the first resistive element 240. Thus, it is possible to prevent or suppress pinch-off degradation.

As described above, the semiconductor device 10 includes: the p-type semiconductor substrate 200 of a first conductive type; the n-type the first impurity layer 210 of a second conductive type that is formed on a surface of the semiconductor substrate 200; the p-type second impurity layer 220 of the first conductive type that is formed to surround the first impurity layer 210 on the surface of the semiconductor substrate 200; an insulating film 230 that covers at least the first impurity layer 210; the first resistive element 240 that is spiral-shaped and is provided on the insulating film 230; the second resistive element 250 that is provided on an outer side of the first impurity layer 210 in a planar view of the semiconductor substrate 10; and a first wiring 260 that couples an end portion of the first resistive element 240 on an outer peripheral side thereof and the second resistive element 250 to each other. Thus, the total resistance value can be increased compared to a case where the second resistive element 250 is not provided, without the first resistive element 240 or the second resistive element 250 straddling the first impurity layer 210 in a planar view. Thus, the consumption of power can be further reduced, while maintaining the characteristics of the JFET.

Also, the power source control IC 400 according to the disclosure includes: the startup circuit 130; the semiconductor device 10v according to the disclosure; and the control circuit 110 that is configured to transmit, to the startup circuit 130, a signal for switching a voltage stepped-down by the semiconductor device 10 on and off. Thus, the power source control IC 400 is obtained that has the advantages of the semiconductor device 10 described above.

A semiconductor device and a power source control IC of the disclosure have been described above based on an illustrated embodiment, but the disclosure is not limited to the foregoing description and the configurations of components can be replaced with any configuration having the same function. Any other components may also be added.

Also, in the embodiment described above, the first conductive substrate is of a p-type conductive type and the second conductive substrate is of an n-type conductive type, but the disclosure is not limited thereto, and a configuration is also possible in which the first conductive substrate is of an n-type conductive type and the second conductive substrate is of a p-type conductive type.

Also, in the embodiment described above, the semiconductor device includes two resistive elements, namely a first resistive element and a second resistive element, but the disclosure is not limited thereto, and a configuration is also possible in which three or more resistive elements are included.

Note that the first resistive element has a circular shape, but this shape is not limited to a shape that is close to the regular-circle shape shown in the drawings, and configurations are also possible in which the first resistive element has a shape consisting of two parallel lines of equal length and two semicircles, a rectangular shape with rounded corners, or an ellipse shape.

Also, in the embodiment described above, the second resistive element has a serpentine shape, but configurations are also possible in which the second resistive element has a similar shape to that of the first resistive element, or has a different shape thereto.

What is claimed is:

1. A semiconductor device comprising:
a semiconductor substrate of a first conductive type;
a first impurity layer of a second conductive type that is formed on a surface of the semiconductor substrate;
a second impurity layer of the first conductive type that is formed to surround the first impurity layer on the surface of the semiconductor substrate;
an insulating film that covers at least the first impurity layer;
a first resistive element that is spiral-shaped and is provided on the insulating film;
a second resistive element that is provided on an outer side of the first impurity layer in a planar view of the semiconductor substrate;
a first wiring that couples an end portion of the first resistive element on an outer peripheral side thereof and the second resistive element to each other; and
a second wiring that is electrically coupled to the first impurity layer, wherein
the second wiring and the first impurity layer are coupled to each other at a plurality of locations.

2. The semiconductor device according to claim 1 wherein, in a planar view of the semiconductor substrate, an outermost peripheral portion of the first resistive element is on an inner side of the first impurity layer, and is separated from the first impurity layer.

3. The semiconductor device according to claim 2, wherein the outermost peripheral portion of the first resistive element and the inner side of the first impurity layer are laterally separated by a distance of 13 µm or more.

4. The semiconductor device according to claim 1, wherein the second resistive element has a serpentine shape that doubles back and forth a plurality of times.

5. The semiconductor device according to claim 1, wherein
the first impurity layer has a circular shape in a planar view of the semiconductor substrate, and
the locations at which the second wiring and the first impurity layer are coupled to each other are end portions of the circular shape, and are evenly spaced along the peripheral direction thereof.

6. The semiconductor device according to claim 1, further comprising a dummy resistor that is provided as an extension of the spiral shape of the first resistive element and is not electrically coupled to the first resistive element.

7. A power source control IC comprising:
a startup circuit;
the semiconductor device according to claim 1; and
a control circuit that is transmits, to the startup circuit, a signal for switching a voltage stepped-down on and off by the semiconductor device.

8. A semiconductor device comprising:
a semiconductor substrate of a first conductive type;
an insulating film formed at a surface of the semiconductor substrate;
a first impurity layer of a second conductive type located on the semiconductor substrate, the second conductive type is opposite from the first conductive type;
a second impurity layer of the first conductive type that is located to surround the first impurity layer on the semiconductor substrate;
a first resistor that is spiral-shaped and is located above the insulating film;
a second resistor above an outer side of the first impurity layer in a planar view of the semiconductor substrate;
a first wiring that couples an outer edge of the first resistor and the second resistor; and
a second wiring that is electrically coupled to the first impurity layer, wherein
the second wiring and the first impurity layer are coupled to each other at a plurality of locations.

* * * * *